United States Patent [19]

Chiffert et al.

[11] Patent Number: 4,595,988

[45] Date of Patent: Jun. 17, 1986

[54] ELECTRONIC METER FOR MEASURING ACTIVE AND REACTIVE ENERGIES IN A THREE-PHASE NETWORK

[75] Inventors: Alain Chiffert, Poitiers; William Galula, Montrouge; Michel Rousseau, Malakoff, all of France

[73] Assignee: Enertec, Montrouge, France

[21] Appl. No.: 543,643

[22] Filed: Oct. 19, 1983

[30] Foreign Application Priority Data

Oct. 20, 1982 [FR] France .................. 82 17579

[51] Int. Cl.[4] .......................................... G01R 21/06
[52] U.S. Cl. ..................... 364/483; 324/107; 324/142
[58] Field of Search ............... 364/481, 483; 324/107, 324/141, 142; 328/160

[56] References Cited

U.S. PATENT DOCUMENTS

| | | | |
|---|---|---|---|
| 3,648,182 | 3/1972 | Carnel | 328/160 |
| 3,723,872 | 3/1973 | Rich | 324/141 |
| 3,875,509 | 4/1975 | Milkovic | 324/142 |
| 4,092,590 | 5/1978 | Watanabe | 324/107 |
| 4,131,847 | 12/1978 | Kohga et al. | 324/141 |
| 4,135,128 | 1/1979 | Kelley, Jr. | 324/107 |
| 4,217,545 | 8/1980 | Kusui et al. | 324/107 |
| 4,300,182 | 11/1981 | Schweitzer, III | 324/141 |
| 4,408,283 | 10/1983 | Kovalchik et al. | 364/483 |
| 4,454,471 | 6/1984 | Schwendtner et al. | 324/107 |

OTHER PUBLICATIONS

"Quantum SQ400" Energy Meter, published by Sangamo Company, 1983.

H. Kohler and G. Steinmüller, Solid State High-Precision kWh and kVArh Meter in a 19" Plug-in Case, Siemens Review, vol. 44, No. 11 (1977), pp. 508-513.

Primary Examiner—Gary Chin
Attorney, Agent, or Firm—Dale Gaudier

[57] ABSTRACT

A plurality of single-phase energy sensors each having a first input connected to a current converter and a second input connected to voltage converter supply pulses to a calculating device. The number of pulses over time represents the energy detected by the single-phase sensor. The calculating device is based on a microprocessor and comprises accumulators controlled by the pulses delivered by the energy sensors for supplying the active and reactive power measurements sought. In the case of a four-wire network, it is not necessary to use voltage transformers for the interphase network voltages, and the energy sensors supply pulses which represent the active and reactive energy of each phase.

10 Claims, 7 Drawing Figures

ELECTRONIC METER FOR MEASURING ACTIVE AND REACTIVE ENERGIES IN A THREE-PHASE NETWORK

The present invention concerns an electronic meter for measuring active and reactive energies in a three-phase network, and more particularly an electronic meter of the type comprising several current and voltage converters connected to a calculating device.

The term current or voltage converter as used herein means a device which transforms a current or a voltage of the network into a signal whose amplitude is compatible with the measuring circuits used.

An electronic device for measuring energy is described in U.S. Pat. No. 3,648,182, this device supplying pulses whose number represents the energy to be measured.

Furthermore, in the case of measuring active and reactive energies in a three-phase, four wire, network, it is usual to use in the meter three inter-phase voltage transformers and three current transformers and in the case of a three wire network, then two inter-phase voltage transformers and two current transformers would be used. In both cases, the number of transformers used is high.

Thus the object of the present invention, by basing itself on a principle similar to that described in U.S. Pat. No. 3,648,182, is to provide a novel electronic meter capable of simultaneously measuring active energy and reactive energy in a three-phase network with a restricted number of transformers.

According to the invention, the meter comprises a plurality of single-phase energy sensors each having a first input connected to a current converter and a second input connected to a voltage converter and delivering energy pulses whose number represents the energy sensed by the energy sensor, and the calculating device is microprocessor-based and comprises accumulating means controlled by the energy sensors for supplying the measurements of the active and reactive powers sought.

In the case of a balanced-voltage four-wire network, the active energy P and the reactive energy Q can be expressed in the form:

$$P = \vec{V}_1 \cdot \vec{I}_1 + \vec{V}_2 \cdot \vec{I}_2 + \vec{V}_3 \cdot \vec{I}_3 \tag{1}$$

$$Q = \frac{1}{\sqrt{3}} (\vec{U}_{23} \cdot \vec{I}_1 + \vec{U}_{31} \cdot \vec{I}_2 + \vec{U}_{12} \cdot \vec{I}_3) \tag{2}$$

$\vec{I}_1$, $\vec{I}_2$ and $\vec{I}_3$ being the phase currents, $\vec{V}_1$, $\vec{V}_2$ and $\vec{V}_3$ being the phase voltages and $\vec{U}_{12}$, $\vec{U}_{23}$ and $\vec{U}_{31}$ being the inter-phase voltages.

Assuming the network is balanced in voltage, one can further write:

$$\vec{V}_1 + \vec{V}_2 + \vec{V}_3 = 0 \tag{3}$$

Since moreover, $\vec{U}_{12} = \vec{V}_1 - \vec{V}_2$, $\vec{U}_{23} = \vec{V}_2 - \vec{V}_3$ and $\vec{U}_{31} = \vec{V}_3 - \vec{V}_1$, it follows from equations (2) and (3) that:

$$Q = \frac{1}{\sqrt{3}} (2\vec{I}_1 \cdot \vec{V}_2 + 2\vec{I}_2 \cdot \vec{V}_3 + 2\vec{I}_3 \cdot \vec{V}_1 + \vec{V}_1 \cdot \vec{I}_1 + \vec{V}_2 \cdot \vec{I}_2 + \vec{V}_3 \cdot \vec{I}_3) \tag{4}$$

If $\vec{I}_1 \cdot \vec{V}_1$, $\vec{V}_1 \cdot \vec{V}_2$, $\vec{I}_2 \cdot \vec{V}_2$, $\vec{I}_2 \cdot \vec{V}_3$, $\vec{I}_3 \cdot \vec{V}_3$ and $\vec{I}_3 \cdot \vec{V}_1$ are respectively designated as $W_1$, $W_2$, $W_3$, $W_4$, $W_5$ and $W_6$, relationships (1) and (4) can be written:

$$\begin{cases} P = 2[\frac{1}{2}(W_1 + W_3 + W_5)] \\ Q = \frac{2}{\sqrt{3}} [W_2 + W_4 + W_6 + \frac{1}{2}(W_1 + W_3 + W_5)] \end{cases} \tag{5}$$

Thus in the case of a balanced four-wire network, for measuring active and reactive power it is sufficient that the voltage converters comprise solely transformers for the three simple network voltages ($V_1$, $V_2$, $V_3$). It is a matter for the line transformers already in place and to which the high voltage connection of the meter is made. With respect to systems using in addition three inter-phase voltage converters, the gain, in the meter according to the invention, is of three transformers. Six single-phase energy sensors are required to supply the signals representing $W_1$ to $W_6$, that is to say pulse trains whose frequencies are respectively proportional to the energies $W_1$ to $W_6$.

In the case of a balanced voltage three wire network, the active energy P' and the reactive energy Q' can be expressed in the form:

$$P' = \vec{U}_{13} \cdot \vec{I'}_1 + \vec{U}_{23} \cdot \vec{I'}_2 \tag{1'}$$

$$Q' = \frac{1}{\sqrt{3}} [(\vec{U}_{23} - \vec{U}_{12}) \vec{I'}_1 + (\vec{U}_{31} - \vec{U}_{12}) \vec{I'}_2] \tag{2'}$$

$\vec{I'}_1$, $\vec{I'}_2$ and $\vec{I'}_3$ being the phase currents and $\vec{U'}_{12}$, $\vec{U'}_{23}$ and $\vec{U'}_{31}$ being the inter-phase voltages.

With $$U'_{12} + U'_{23} + U'_{31} = 0, \tag{3'}$$

it follows that:

$$Q' = \frac{1}{\sqrt{3}} (2\vec{I'}_1 \cdot \vec{U'}_{23} - 2\vec{I'}_1 \cdot \vec{U'}_{13} - 2\vec{I'}_2 \cdot \vec{U'}_{13} + \vec{I'}_1 \cdot \vec{U'}_{13} + \vec{I'}_2 \cdot \vec{U'}_{23}) \tag{4'}$$

If $\vec{I'}_1 \cdot \vec{U'}_{13}$, $\vec{I'}_1 \cdot \vec{U'}_{23}$, $-\vec{I'}_1 \cdot \vec{U'}_{13}$, $\vec{I'}_2 \cdot \vec{U'}_{23}$ and $-\vec{I'}_2 \cdot \vec{U'}_{13}$ are respectively designated as $W'_1$, $W'_2$, $W'_3$, $W'_4$, and $W'_5$, relationships (1') and (4') can be written:

$$\begin{cases} P' = 2[\frac{1}{2}(W'_1 + W'_4)] \\ Q' = \frac{2}{\sqrt{3}}[W'_2 + W'_3 + W'_5 + \frac{1}{2}(W'_1 + W'_4)] \end{cases} \tag{5'}$$

Thus in the case of a balanced three-wire network, to measure active and reactive power it is sufficient that the voltage converters comprise solely line transformers for the two inter-phase voltages ($U'_{13}$ and $U'_{23}$). With respect to a system which would use in the meter two inter-phase voltage converters, the gain is two voltage transformers. Five single-phase energy sensors are required for producing the signals representing $W'_1$ to $W'_5$, that is to say, pulse trains whose frequencies are respectively proportional to the energies $W'_1$ to $W'_5$.

Advantageously, the pulses supplied by all the sensors each represent an equal quantum of energy in absolute value. Also, to simplify the processing of these pulses by the device, and to take account of the coefficient ½ appearing in relationship (5) and (5'), means are provided for dividing by two the frequency of the pulses supplied by the single-phase sensors which sense the energies forming components of the active energy sought.

Again advantageously, each single-phase energy sensor comprises two pulse-emitting outputs; one emits pulses supplied by the sensor to represent a positive energy, the other, pulses representing a negative energy, in accordance with the direction of energy transfer on the network. For convenience, in the rest of this test, these outputs are called the positive output and the negative output, without any limitation on the polarity of the signal which they supply.

The direct accumulation of the positive and negative energy pulses in positive and negative energy accumulation registers would have no physical significance while the quantities P and Q or P' and Q' as expressed by relationships (5) and (5') include, independently of their sign, several components which can be positive or negative. So, according to a characteristic of the meter according to the invention, an energy pulse of a particular sign, when it is sensed by the calculating device, is used to cancel the effect of one of the preceding energy pulses of opposite sign by a following energy pulse of the same sign.

To this end, the calculating means comprise:

an active energy tendency register controlled by the active energy pulses supplied by the single-phase sensors which sense the energies forming the components of the active energy sought, this tendency register running in one direction between an extreme negative state and an extreme positive state in response to positive energy pulses, and in the opposite direction in response to negative energy pulses, said tendency register being capable of taking at least one intermediate state between its extreme states, a positive active energy accumulation register of which the contents are incremented in response to each positive active energy pulse while the active energy tendency register is in its extreme positive state, and a negative active energy accumulation register of which the contents are incremented in response to each negative active energy pulse while the active energy tendency register is in its extreme negative state.

In the same manner, for the determination of reactive energy, there are provided a reactive energy tendency register, a positive reactive energy accumulation register and a negative reactive energy accumulation register, similar to those provided for the determination of active energy.

Other characteristics and advantages of the electronic meter according to the invention will become apparent from the description given hereafter, by way of non-limitative example, with reference to the accompanying drawings, in which.

Figure 1:
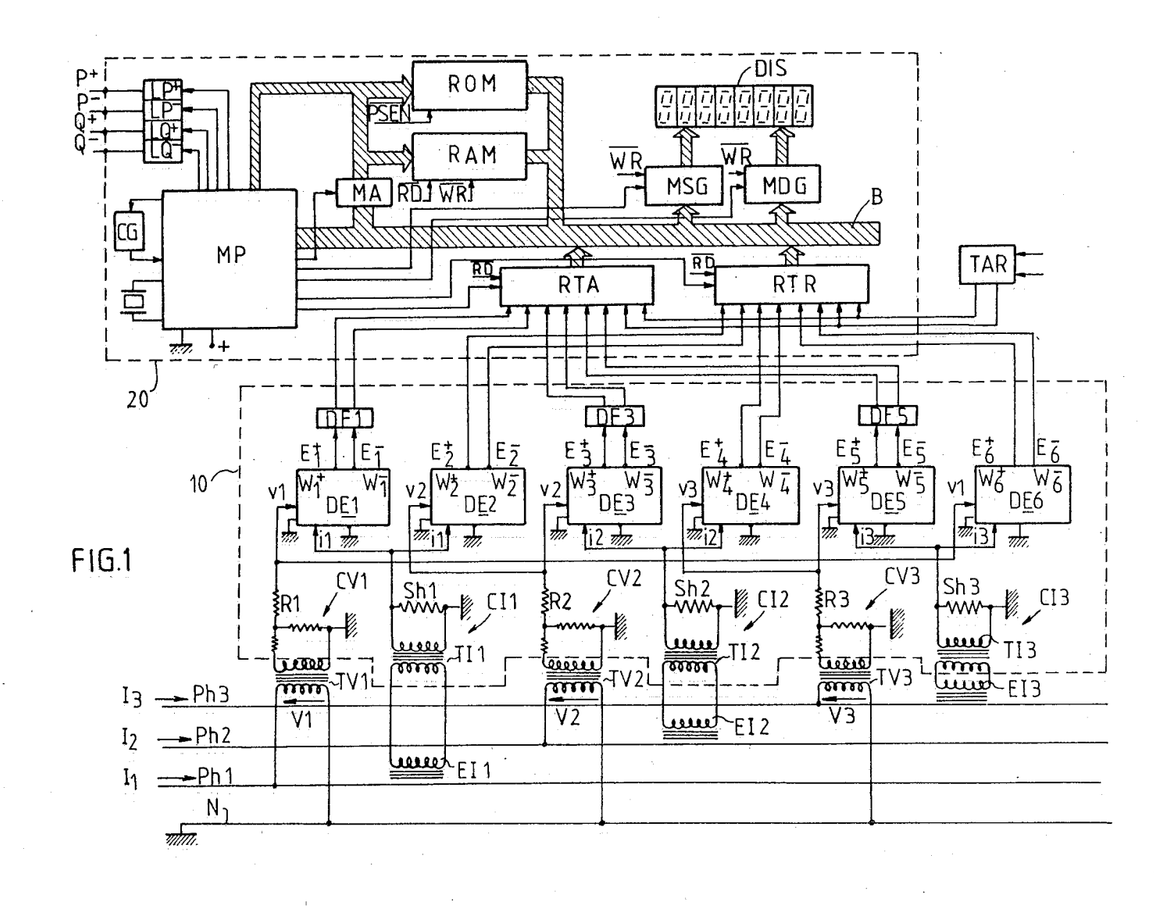
FIG. 1 is a block diagram of an implementation of an electronic meter according to the invention in the case of a four wire network.

The meter illustrated in FIG. 1 is intended for the determination of active and reactive power consumed (or fed back) by a consumer connected to a balanced voltage, 4 wire network, and comprises a measuring device 10 and a calculating device 20.

Three voltage converters CV1, CV2 and CV3 produce voltages $\vec{v_1}, \vec{v_2}, \vec{v_3}$ proportional to the measured voltages $\vec{V_1}, \vec{V_2}$, and $\vec{V_3}$ of the network. In a manner well known per se, each converter is formed by a voltage transformer (TV1, TV2, TV3), of which the primary is connected between the corresponding phase (Ph1, Ph2, Ph3) and the neutral N, and of which the secondary is connected to the terminals of a potential divider. The voltage $\vec{V_1}, \vec{V_2}, \vec{V_3}$ is taken from an intermediate point on the potential divider by means of an adjustable resistance $R_1, R_2, R_3$ of high impedance.

Additionally, three current converters (CI1, CI2, CI3) produce voltages $\vec{i_1}, \vec{i_2}, \vec{i_3}$ proportional to the magnitudes of the currents $\vec{I_1}, \vec{I_2}, \vec{I_3}$ in the phase $Ph_1, Ph_2, Ph_3$. In a manner equally well known, each converter CI1, CI2, CI3 comprises a transformer TI1, TI2, TI3, of which the primary is connected to a winding EI1, EI2, EI3 coupled to the respective phase, and of which the secondary is connected across a shunt Sh1, Sh2, Sh3 at the terminals of which the voltage $\vec{i_1}, \vec{i_2}, \vec{i_3}$ is available. The transformers TV1, TV2 and TV3 and the windings EI1, EI2 and EI3 are in place in the line, and do not form part of the meter, which is connected to the network as shown by the dotted line delineating the measuring device 10.

Figure 2:
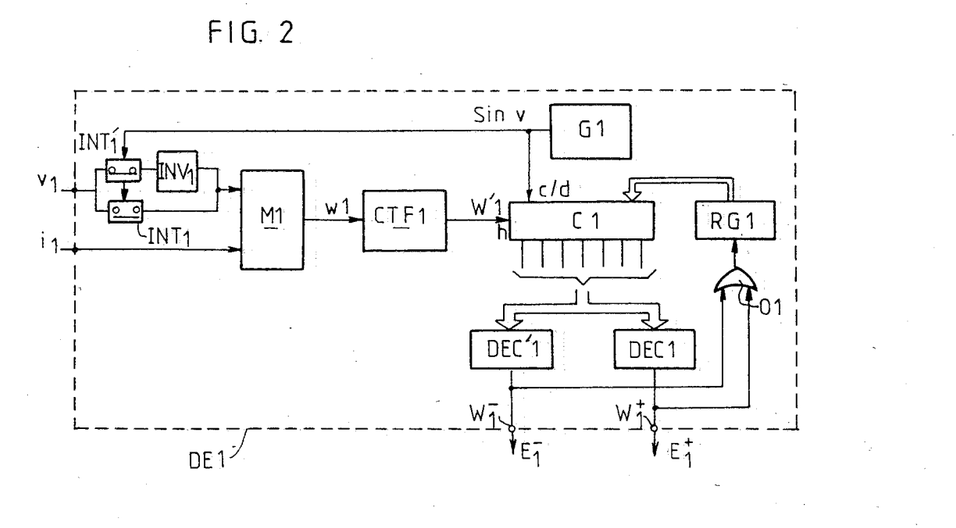
FIG. 2 is a more detailed block diagram of an energy sensor forming part of the meter of FIG. 1.

The measuring apparatus 10 comprises six energy sensors DE1 to DE6 which supply pulses with frequencies proportional to the quantities $W_1$ to $W_6$ defined herein above. To this end, the sensors DE1 to DE6 receive the following respective pairs of voltages: $(\vec{i_1}, \vec{v_1})$, $(\vec{i_1}, \vec{v_2})$, $(\vec{i_2}, \vec{v_2})$, $(\vec{i_2}, \vec{v_3})$, $(\vec{i_3}, \vec{v_3})$ and $(\vec{i_3}, \vec{v_1})$. Each sensor DE1 to DE6 has a positive output $W_1+$ to $W_6+$ and a negative output $W_1-$ to $W_6-$. The pulses supplied by each detector appear at its positive output when the measured energy is being taken from the network by the consumer and on its negative output when the energy measured is being fed back into the network by the consumer. A particular implementation of an energy sensor, for example DE1, is shown in FIG. 2, the other sensors DE2 to DE6 being identical to DE1.

The energy sensor DE1 comprises a first input which receives the voltage $\vec{i_1}$ supplied by the converter CI1 and a second input which receives the voltage $\vec{V_1}$ supplied by the converter CV1. The voltage $\vec{i_1}$ is applied to one input of an analogue multiplier M1, while the voltage $\vec{V_1}$ is applied to the other input of this multiplier, either just as it is via a switch INT1, or phase-inverted by 180° by the intermediary of a circuit which comprises, in series, a switch INT'1 and a phase-inverter INV1. The switches INT1 and INT'1 are switches, for example solid state, controlled in synchronism by an inversion signal $S_{inv}$ such that one is closed while the other is open. The signal $S_{inv}$ is generated by a generator G1 in the form of a train of rectangular pulses of fixed frequency $F_{inv}$ defining equal durations of opening and closure of each of the switches INT1 and INT'1. The analogue signal $W_1$ produced at the output of the multiplier M1 and proportional to $\vec{v_1} \cdot \vec{i_1}$ is applied to a voltage to frequency converter CTF1 to be converted into a signal $W'_1$ formed by a train of elementary pulses whose frequency is proportional to $\vec{v_1} \cdot \vec{i_1}$. These pulses are applied to the clock input of a reversible counter CD1 whose count direction is controlled by the inversion signal Sinv applied to the up/down control input c/d. Two decoders DEC1, DEC'1 are connected in parallel to the outputs of the up/down counter CD1. The decoder DEC1 supplies a pulse at the output $W_1+$ when the contents of the up/down counter CD1 reach a first predetermined value $N_1$, while the decoder DEC'1 supplies a pulse at the output $W_1-$ when the contents of the up/down counter CD1 reach a second predetermined value N'1. These pulses control, by means of an OR-gate 01, the resetting of the counter to an initial predetermined value N0 stored in a register RG1. The values N'1, N0 and N1 are such that $N'1 < N0 < N1$.

While no current flows in the shunt SH1, $\vec{i_1}$ is zero, and the output of the mutliplier M1 is normally at the zero level. The converter CTF1 then produces pulses at a base frequency $F_0$. During each period of the inversion signal, the same number of pulses is successively counted up (or counted down) then counted down (or counted up). The frequencies $F_0$ and $F_{inv}$ and the values N0, N1 and N'1 are chosen such that the counter, once reset to the value N0, does not attain either of the values N1 or N'1.

When a current flows in the shunt, there is a correlation between the current and the voltage. According to the direction of flow of this current, the multiplier M1 will produce a voltage of which the amplitude will be, during the first half periods of $S_{inv}$ corresponding to the closure of INT1 and to the operation of CD1 in the counting up direction, greater or less than that of the voltage produced during the second half periods of $S_{inv}$ corresponding to the closure of INT'1 and to the operation of CD1 in the counting down direction. In the first case, the frequency of the elementary pulses $W'_1$ is greater during the first half periods of $S_{inv}$ than during the second and the contents of CD1 increase towards the value N1; this value being reached, a positive energy pulse $E_1+$ is produced at the output $W_1+$, the counter CD1 is reset to the value N0 and the process is repeated, the pulses $E_1+$ appearing at a frequency proportional to $W_1$. In the second case, the frequency of the elementary pulses $W'_1$ is greater during the second half periods of $S_{inv}$ than during the first and the contents of CD1 decrease towards the value N'1; this value being reached, a negative energy pulse $E_1-$ is produced at the output $W_1-$, the counter CD1 is reset to the value N0 and the process is repeated, the pulses $E_1-$ appearing at a frequency proportional to $W_1$.

In the same manner, positive energy pulses $E_2+$ to $E_6+$ are supplied at the ouputs $W_2+$ to $W_6+$ at frequencies proportional to the quantities $W_2$ to $W_6$ and negative energy pulses $E_2-$ to $E_6-$ are supplied at the outputs $W_2-$ to $W_6-$ at frequencies proportional to the quantities $W_2$ to $W_6$. All the pulses $E_1+$ to $E_6+$ and $E_1-$ to $E_6-$ represent the same quantity of energy in absolute value.

These different pulses are transmitted to the calculation device 20 where the active and reactive powers sought are calculated by applying relationships (5) above. To take account of the coefficient $\frac{1}{2}$ appearing in these relationships before the sum $W_1+W_2+W_5$, and to simplify the calculation, the frequency of the pulses $(E_1+, E_1-)$, $(E_3+, E_3-)$ and $(E_5+, E_5-)$ is divided by two by means of frequency dividers DF1, DF3 and DF5 connected to the respective outputs of DE1, DE3 and DE5 (FIG. 1). Thus the calculating device receives pulses of which the frequencies are respectively proportional to $W_1/2$, $W_2$, $W_3/2$, $W_4$, $W_5/2$ and $W_6$. By choosing for all the energy sensors identical values for N1, the positive energy pulses received by the calculating device are proportional to $W_1/2$, $W_2$, $W_3/2$, $W_4$, $W_5/2$ and $W_6$ with the same coefficient of proportionality $K+$. Similarly, by choosing corresponding equal values of N'1, the negative energy pulses received by the calculating device are proportional to $W_1/2$, $W_2$, $W_3/2$, $W_4$, $W_5/2$ and $W_6$ with the same coefficient of proportionality $K-$.

If $N_1-N_0 = N_0-N'_1$, the coefficients $K+$ and $K-$ are equal to each other. In contrast, if $N_1-N_0$ does not $= N_0-N'_1$, these coefficients are different. For example, if $N_1-N_0 = K(N_0-N'_1)$, the frequency of the negative energy pulses is K times higher than that of the positive energy pulses for the same absolute value of energy. This fact will be taken into account either by dividing the frequency of the negative energy pulses by the value K before applying them to the calculating device, or by taking account of only one negative energy pulse in K at the moment of the entry of these energy pulses into the calculating device.

Hereinafter, it will be supposed, unless the contrary is indicated, that $K+ = K-$, that is to say all the energy pulses, of equal frequency, represent the same amount of energy in absolute value.

The calculating device 20 (FIG. 1) comprises a microprocessor MP, associated with a read only program memory ROM, a random access memory RAM and input/output circuits. In the case where the microprocessor has no internal memory, a multiplex bus B can be provided on which the data and the low addresses are simultaneously transmitted. An address memory device MA formed by a collection of bistables permits the address on the bus B to be memorised at an instant determined by a signal ALE produced by the microprocessor MP.

The program memory ROM has its low address inputs connected to MA and its high address inputs connected directly to the microprocessor MP. Its data outputs are connected to the bus B the order for writing on the bus being supplied by a signal PSEN produced by the microprocessor.

The random access memory RAM has its address inputs connected to MA and its data inputs and outputs connected to the bus B. The orders for writing to and reading from the bus B are given by signals $\overline{RD}$ and $\overline{WR}$ produced by the microprocessor MP.

The input/output circuits comprise a memory device for memorising the energy pulses received from the measurement device 10. This memory device comprises, for example, two three-state buffer registers, one RTA receiving the pulses produced at the outputs of the frequency dividers DF1, DF3, DF5 and serving to determine the active power and the other RTR receiving the pulses produced at the output of the energy detectors DE2, DE4 and DE6. The remaining inputs of the register RTA and of the register RTR can be used for the inputing of signals relating to the tariff periods and produced by a circuit TAR receiving conventional signals indicative of the changing of the tariff period. The selection of the registers RTA and RTR is effected by means of respective control signals produced by the microprocessor MP and the writing of the contents of these registers on the bus B is controlled by the signal $\overline{RD}$.

The input/output circuits also comprise a memory device connected between the bus B and a display device DIS formed by a group of seven segment characters or digits. The display is for example multiplexed. In a first time interval, a group of binary signals representing the states of the segments is memorised in a memory MSG formed by a group of bistables and selected by a particular control signal produced by the microprocessor. Then, a group of signals representing the states of the characters is stored in a memory MDG also formed by a collection of bistable elements and selected by a particular control signal produced by the microprocessor. The order for storing in the memories MSG and MDG is given by the signal $\overline{WR}$.

The microprocessor MP has four more outputs connected to relay circuits LP+, LP−, LQ+ and LQ−, in order to produce at the respective outputs of the meter pulses representing the measured active positive power P+, active negative power P−, reactive positive power Q+ and reactive negative power Q−.

Finally, the microprocessor is connected to a clock generating circuit CG which includes a crystal for producing the frequency of its internal clock and to two terminals carrying reference and supply potentials.

The structure of the calculating device described hereinbefore is only one particular implementation. Any other microprocessor processing system permitting the same results to be achieved could be used.

Figure 3:
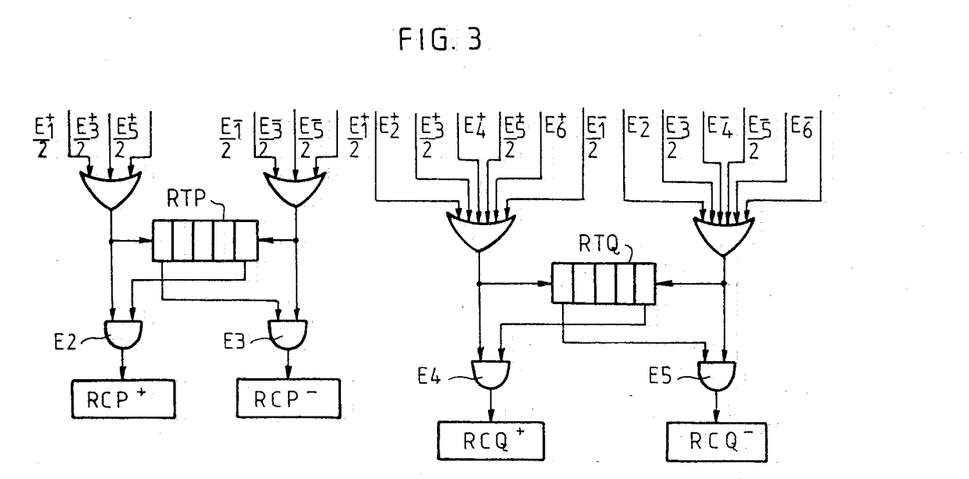
FIG. 3 illustrates the principle for the processing of the energy pulses by the calculating device.

Before describing in more detail certain of the operations effected by the calculating device 20, a prefered method of processing the energy pulses is described hereinafter with reference to FIG. 3.

For the determination of the active energy, one takes into account the pulses $E_1^+$, $E_3^+$, $E_5^+$, $E_1^-$, $E_3^-$, and $E_5^-$, after division of their frequency by two. Each positive energy pulse is applied to one input of an active energy tendency register RTP while each negative energy pulse is applied to another input of the register RTP. The register RTP can evolve in one direction or in the other between an extreme negative state and an extreme positive state. In the extreme positive state, the register RTP supplies an indicator signal which opens a gate E2 to each positive energy pulse received, while in the extreme negative state, this register supplies a indictor signal which opens a gate E3 to each negative energy pulse received. The register RTP can take at least one, and preferably several intermediate states between its extreme states. Supposing that the register RTP is in its extreme positive state, and a positive energy pulse is received, this pulse is taken into account via the gate E2 and counted in an accumulation register RCP+ for the positive active energy, but if a negative energy pulse is received, this pulse is not taken into account but places the register RTP in the intermediate state nearest the extreme positive state. In this latter case, if the following pulse received is positive, it is not taken into account but restores the register RTP into its extreme negative state and if this following pulse received is negative, it takes the register RTP another step towards its extreme negative state. If the register RTP reaches this state, and if a negative energy pulse arrives, it is taken into account via the gate E3 and counted in an accumulation register RCP− for the negative energy. Thus each energy pulse received is not directly taken into account in an accumulation register, but is processed in the changing context of a continuous accounting of the preceding pulses.

One can use for example as the tendency register a shift register of n positions all occupied by zeros except one occupied by a one constituting the tendency indicator. Each positive energy pulse shifts the register in one direction (to the right) until the indicator finds itself in the rightmost position (extreme positive state) while each negative energy pulse shifts the register in the other direction (to the left) until the indicator finds itself in the leftmost position (extreme negative state). When the indicator finds itself in an extreme position and a pulse of the same sign is received, then this pulse is accumulated while the position of the indicator remains unchanged.

For the determination of the reactive energy, one takes into account the pulses E1+, E3+, E5+, E1−, E3−, E5− after division of their frequency by two and the pulses E2+, E4+, E6+, E2−, E4− and E6−. The received pulses are used to determine the active energy through the use of a reactive energy tendency register RTQ. In its extreme positive state, the register RTQ permits, by means of its tendency indicator, the taking into account of the positive energy pulses via a gate E4, and their counting in a positive reactive energy accumulation register RCQ+ and, in its extreme negative state, the register RTQ permits, by means of its tendency indicator, the taking into account of the negative energy pulses via a gate E5, and their counting in a negative reactive energy accumulation register RTRCQ−.

The calculating device 20 is programmed principally to accomplish the following tasks:

(a) acquisition of energy pulses and tariff periods;
(b) outputting relay pulses P+, P−, Q+, Q−;
(c) changing the value displayed;
(d) calculation of P and Q according to the relationships 5.

A sub-routine effects the processing of the accumulator pulses for task (d).

An interrupt routine triggered by interrupt signals produced by a sequencer executes task (a) to (c).

To pass from the interrupt routine to the sub-routine, one uses for example two memories structured in stacks PILEA and PILEB associated with two pointers respectively PTPILA, PTPILR. The program for acquiring the energy pulses fills the stacks PILEA and PILER from the reading of the buffer registers RTA and RTR respectively. A sub-routine (calculation of P and Q) empties the stacks PILEA and PILER.

Similarly in order to exit from the sub-routine to task (b), one uses four relay pulse counters CP+, CP−, CQ+, CQ−, which are incremented by the sub-routine, (calculation of P and Q) and decremented by the program under interruption (outputting of relay pulses).

The aquisition of energy pulses is effected in response to each interrupt signal, these being produced by the sequencer with a period of such that no energy impulse risks being lost even when the power on the network is at a maximum.

Figure 4:
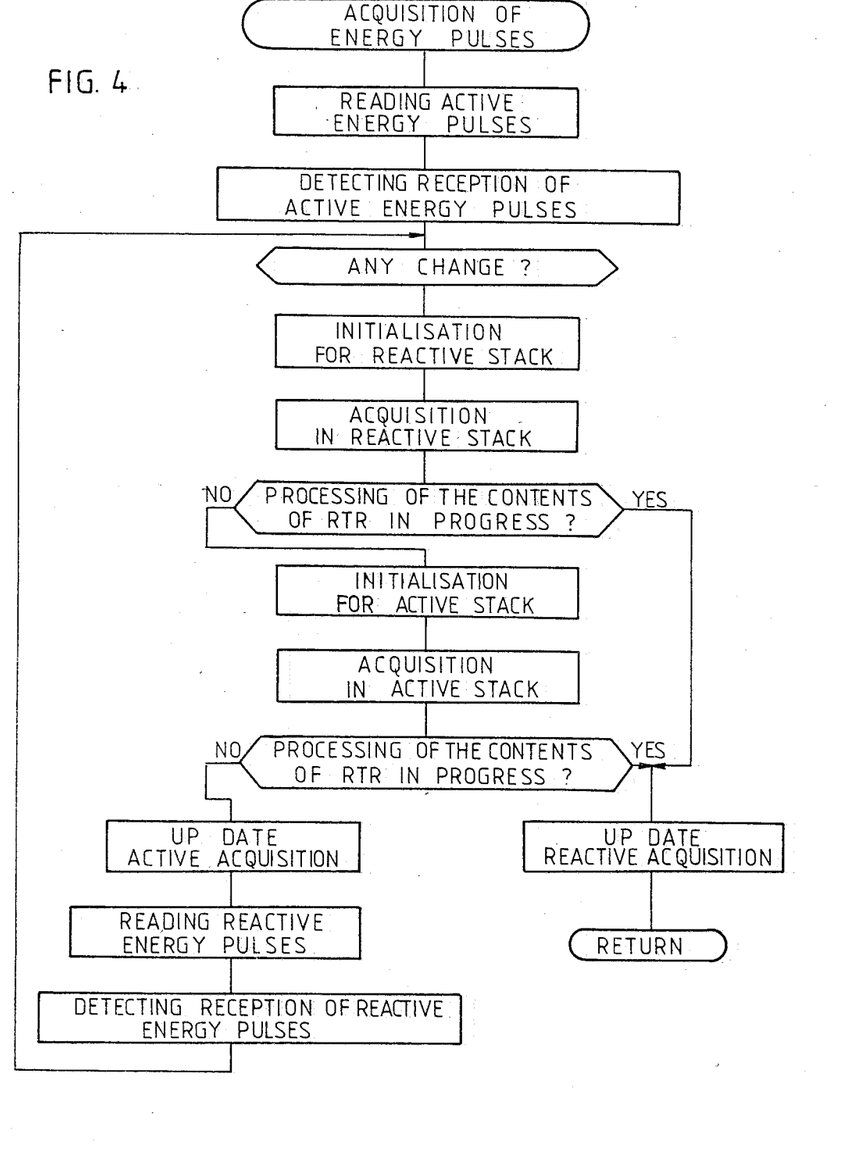
FIGS. 4 to 6 show flow diagrams relating to different programs executed in the calculating device.

In brief, for the acquisition of energy pulses, one first detects the reception of new energy pulses by the register RTA in order to enter the corrsponding information in the stack PILER and in the stack PILEA (since the energy pulses counted for the active energy are also for the reactive energy) then one detects the reception of new energy pulses by the register RTR in order to enter the corresponding information in the stack PILER. The operations effected are principally the following (FIG. 4):

(a) read the contents of RTA ("read active energy pulses");

(b) comparison of the word read with that contained in a register RMA—in which is stored the word read in RTA in the course of the preceeding interruption, in order to detect the change in the state of a bit of this word in the intervening period ("detection of the reception of active energy pulses"); it will be noted that the detection of each change of state of the energy signals received applies the coefficient 2 appearing in the relationships 5.

(c) examination of the result of comparison ("test if changes");

(d) if this test is negative (no change detected in RTA), detection of the reception of new pulses in RTR ("processing of the contents of RTR"); if this test is positive, generation of the information to be introduced in the stack PILER ("initialisation for reactive stack");

(e) introduction into the stack PILER of the information generated ("acquisition in reactive stack");

(f) test if the "processing of the contents of RTR" is in progress;

(g) this test being negative, generation of the information to be introduced in the stack PILEA ("initialisation for active stack");

(h) introduction into the stack PILEA of the information generated ("acquisition in active stack");

(i) test if the "processing of the contents of RTR" is in progress;

(j) this test being negative, update the contents of RMA with the word read in RTA ("up-date active acquisition");

(k) read the contents of RTR ("read reactive energy pulses");

(l) comparison of the word read with that contained in a register RMR, in which is stored the word read in RTR in the course of the preceding interruption, in order to detect a change of state in the intervening period ("detection of the reception of reactive energy pulses");

(m) return to "test if changes";

(n) if this test is negative (no change detected in RTR), passing to the phase "processing of the contents of RTR"; if this test is positive, passing to the phase "initialisation for reactive stack";

(o) "acquisition in reactive stack";

(p) test "processing of the contents of RTR in course";

(q) this test being positive, updating the contents of RMR with the word read in RTR ("update reactive acquisition");

(r) and return to the sub-routine.

The processing of the acquired energy pulses and the calculation of the active and reactive energies sought is effected during the sub-routine. Suppose that three different tariff periods are provided (night N, day J and peak P). Then in the memory RAM there are always stored 12 energy values, that is the positive and negative accumulated active and reactive energy values, for each tariff period N, J and P, being:

$P+N$, $P-N$, $Q+N$, $Q-N$, $P+J$, $P-J$, $Q+J$, $Q-J$, $P+P$, $P-P$, $Q+P$, and $Q-P$. Each accumulated energy value is in B C D (binary coded decimal), and comprises an integer part of eight numbers (coded in four octects) and a remainder of eight numbers (coded also in four octects). It is supposed furthermore that the tendency registers RTP, RTQ are shift registers comprising an even number of stages.

Figure 5:
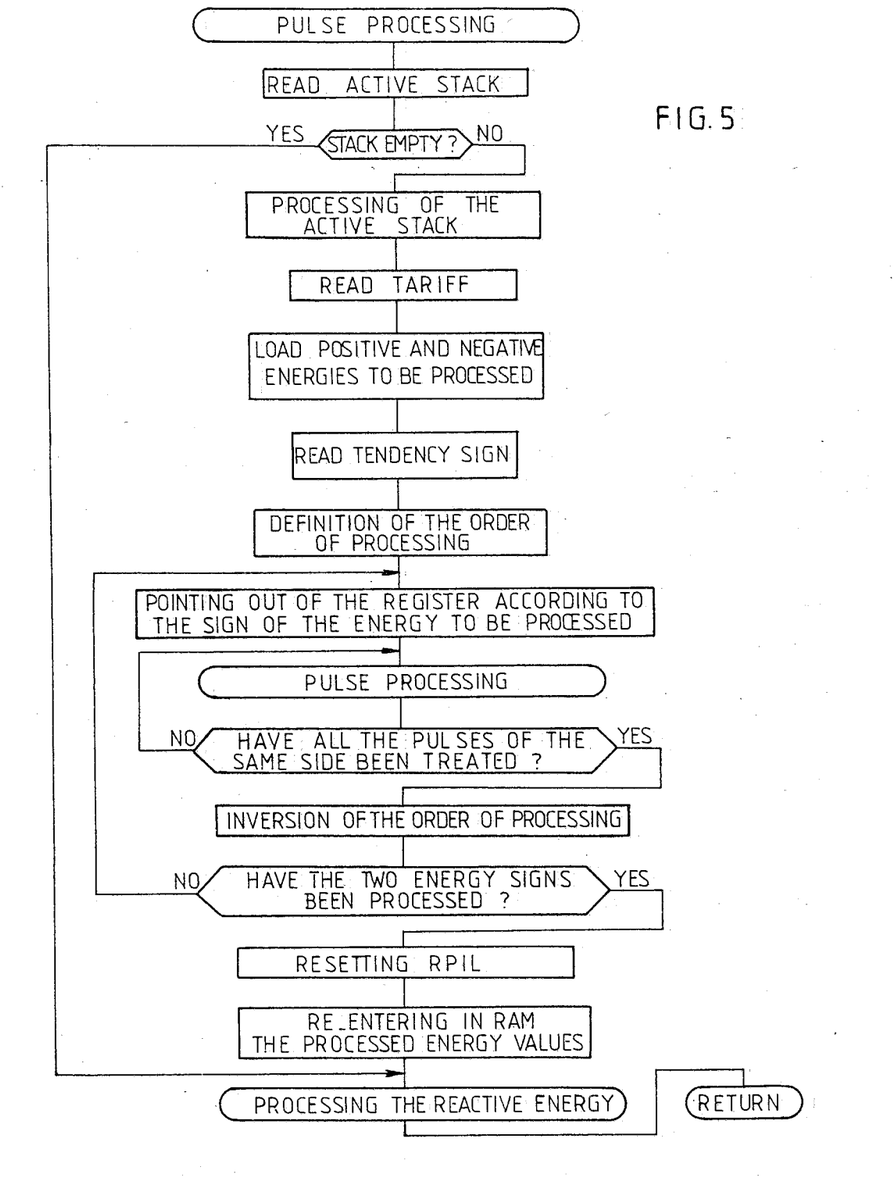

The pulse processor program (FIG. 5) comprises the following operations (only the processing of pulses to calculate the active power will be described):

(a) reading of the stack PILEA ("read active stack");

(b) test "stack empty" by examination of the stack pointer PTPILA;

(c) if the test is positive, pass to the end of the program for processing active energy pulses;

(d) if the test is negative, load a register RPIL with the value contained in the first position in the stack PILEA and shift all the other values in the stack by one position for the next processing ("processing of the active stack");

(e) reading of the tariff period information—this information is supplied onto inputs of the register RTA and is thus coded in two bits in the word loaded into the register RPIL—("read tariff");

(f) loading in an auxilliary calculation register RAUX the positive and negative active energy values corresponding to the tariff read ("load positive and negative energies to be processed");

(g) determination of the tendency sign information SENS+ or SENS− according to whether the indicator of the tendency register is in the right half of the register RTP or in the left half of the register and the positioning of an indicator MSENS which stores the tendency sign information ("read tendency sign");

(h) determination of the order of processing of the positive and negative active energies, the energy processed first being that of opposite sign to that of the tendency ("definition of the order of processing");

(i) selection in the register RAUX of the energy value corresponding to that to be treated first ("pointing out of the register according to the sign of the energy to be processed");

(j) execution of the sub-program "pulse processing" (see hereinafter) on the first energy pulse from RPIL of which the sign is that of the energy in the course of processing;

(k) successive processing of other pulses of energy of this sign by the test "have all the pulses of the same side been treated?" then, the test being negative, return to the sub-program "pulse processing";

(l) when the preceding test becomes positive, inverting the order of processing of the energies ("inversion of the order of processing");

(m) test "have the two energy signs been processed?", then the test being negative, return to "pointing out the register according to the sign of the energy to be processed";

(n) the energy pulses of the other sign all being processed and the test "have the two energy signs been processed" having become positive, resetting the register RPIL to its state at the start of processing "resetting RPIL";

(o) re-entering in the RAM the new calculated values of positive and negative active energy in the locations corresponding to the tariff re-read in RPIL ("re-entering in RAM the processed energy values");

(p) test "have the active and reactive energies been processed?";

(q) if the test is negative, processing the reactive energy in the same manner as hereinbefore described for the active energy and, if the test is positive, "return".

Figure 6:
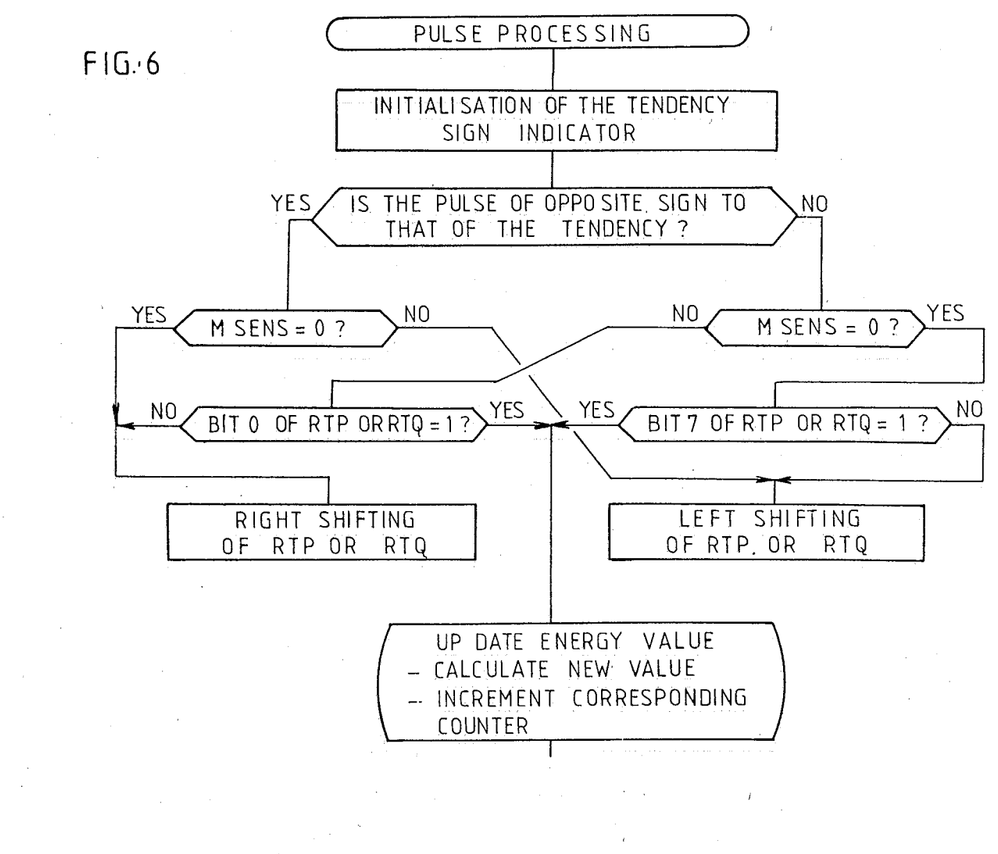

The sub-program "pulse processing" comprises the following operations (FIG. 6):

(a) initialisation of the tendency sign indicator corresponding to the energy processed ("initialisation MSENS");

(b) test "is the pulse of opposite sign to that of the tendency?";

(c) if this test is negative (after inversion of the order of processing), test the value of the tendency sign indicator ("MSENS=0?");

(d) if this value is 0 (negative tendency) and the tendency register is in its extreme negative state with the tendency indicator in the leftmost position of this register ("bit 7 of RTP or RTQ=1"), pass to the sub-program "up-date the energy value"; if the value of MSENS is zero (negative tendency) but the tendency register is not in its extreme negative state, shifting of this register one step to the left ("shift left RTP or RTQ"); if the value of MSENS is not zero (positive tendency) and while the tendency register is in its extreme positive state with the tendency indicator in the rightmost position of this register ("bit 0 of RTP or RTQ=1"), pass to sub-program "up-date energy value"; finally if the value of MSENS is not zero (positive tendency) but the tendency register is not in its extreme positive state, shifting of this register by one step to the right ("right shifting of RTP or RTQ");

(e) in the case where the test "is the pulse of opposite sign to that of the tendency?" is positive (first passage), if the value of MSENS is 0 (negative tendency—test "MSENS=0?" positive), passing to the phase "right shifting of RTP or RTQ" and if the value of MSENS is not 0 (positive tendency—test "MSENS=0?" negative), passing to the phase left shifting of RTP or RTQ".

Thus first the pulses of sign opposite to that of the tendency are treated, only the pulses of the same sign being then able to eventually be taken into account in modifying the value of the energy processed. It will be noted also that the value of the indicator MSENS is reinitialised at each new execution of the sub-program "pulse processing", this value being capable of having changed by reason of the preceding execution of this sub-program.

The sub-program "up-date the energy value" comprises a calculating phase which consists of adding to the energy pointed out in the register RAUX the quantity represented by the validated pulse. In a general way, this quantity is affected by coefficient K for the active energy and by a coefficient $K/\sqrt{3}$ for the reactive energy. This coefficient can take account of the transformation relationship high voltage/low voltage. In a variant, and in order to simplify the processing, one can choose $K=1$ and take care of this transformation relationship at the billing level. After taking account of the validated energy pulse, one obtains in the register RAUX a new energy value with a new integer part and a new remainder. The sub=program "up-date the energy value" also includes a phase of incrementing the corresponding counter of transmitted pulses, the contents of this counter being increased by a number equal to the increase of the total value of the energy being processed.

The control of the pulse transmitters LP+, LP−, LQ+, and LQ− is a priority takes executed after each N1 interruption signals emitted by the sequencer. To this end, a counter receives the interruption signals on its clock input, and, when it reaches the value N1, is reset to the value zero and controls the execution of a relay pulse processing program. For each relay, this program comprises the following operations:

(a) acquisition of the state of the relay;

(b) if the relay is closed, opening of the relay; and (c) if the relay is open and if the associated relay pulse counter is not at zero, closure of the relay and decrementation of this counter by 1.

Finally, the display of the energy values stored in RAM is a priority task executed every N2 interruption signals emitted by the sequencer. To permit easy reading, with a not-too-low update frequency of the display values, N2 is chosen for example such that the display of each value lasts several seconds. A counter receives the interruption signals on its clock input and, when it reaches the value $N_2$, is reset to the value 0 and controls the display of a new value. To this end, it is provided with a display table which gives the order in which the energy values are displayed and which is associated with a display pointer. The table comprises a collection of 12 storage locations each containing the address display code of a particular energy value. Each time a new energy value is displayed, the display pointer is incremented. The information displayed comprises a part identifying the energy concerned and the number representing the value of this.

In the proceeding, the case was envisaged where, in order to take account of the coefficient ½ in the relationships (5), the divide-by-two frequency dividers are connected to the outputs of the energy detectors DE1, DE3 and DE5.

As a variant, the pulses E1+, E1−, E3+, E3− and E5+, E5− could be applied directly to the calculating device, like the other pulses, and said coefficient ½ could be taken into account in the course of the energy pulse acquisition program by detecting, for the words read in the register RTA, not all the changes of state, but only the changes in the same sense.

Furthermore, a particular implementation of a meter according to the invention has been described, for the case of a balanced voltage four wire network.

Figure 7:
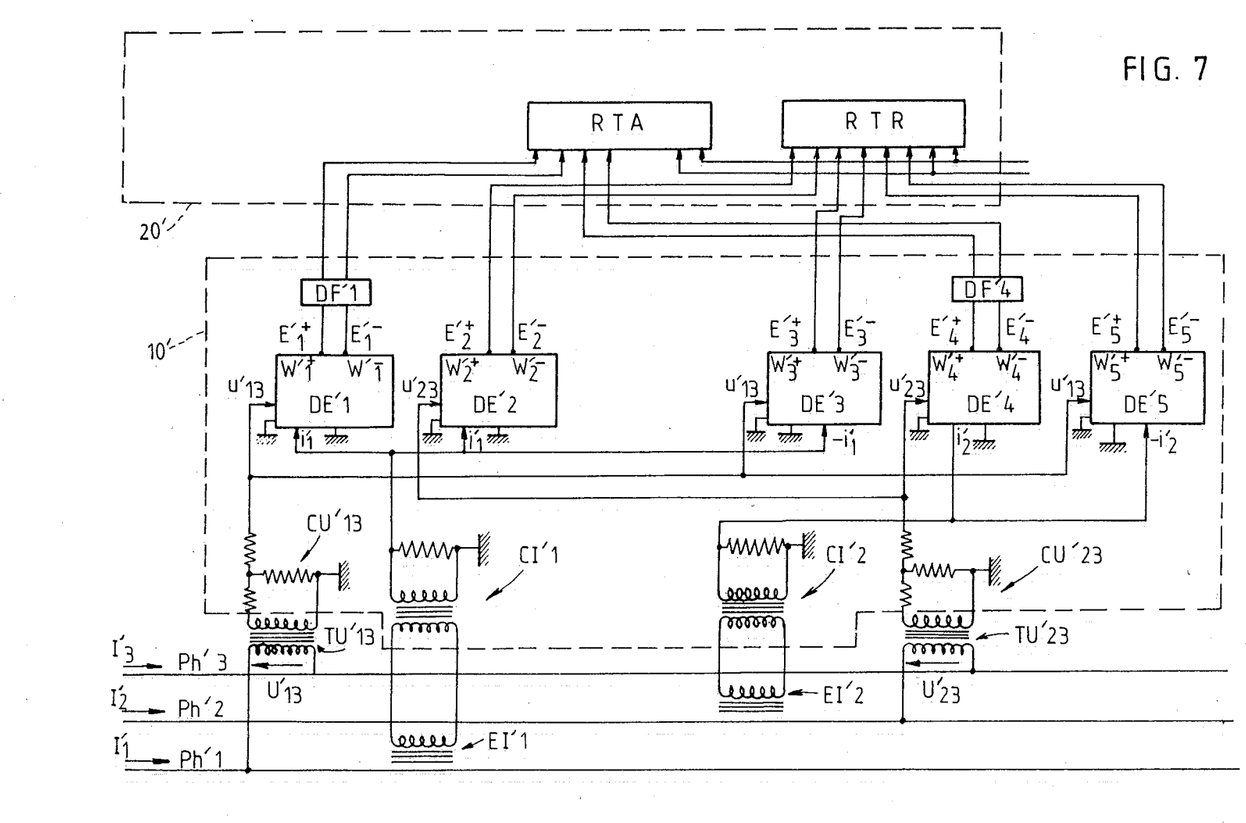
FIG. 7 is a partial block diagram of an implementation of an electronic meter according to the invention in the case of a three-wire network.

However, the invention is equally applicable to three-wire networks, as shown in FIG. 7. In this case, the metering is effected on the basis of equations (5') given hereinbefore. To this end, two voltage converters CV'1, CV'2 provide voltages $\vec{u}'_{13}$ and $\vec{u}'_{23}$ proportional to the interphase voltages $\vec{U}'_{13}$ and $\vec{U}'_{23}$ of the network. These converters comprise two voltage transformers TU'13 and TU'23 of which the primaries are connected respectively between the phases PH'1 and PH'3 and between the phases PH'2 and PH'3. The voltages $u'_{13}$ and $u'_{23}$ are taken from the output of potential dividers, connected to the secondaries of the transformers TU'13 and TU'23. Furthermore, two current converters TI'1 and TI'2, analogous to those used with the four wire network, supply voltages i'1 and i'2 proporational to the phase currents i'$_1$ and i'$_2$. The transformers TU'13 and TU'23 as well as the windings EI'1 and EI'2 of the converters TI'1 and TI'2 are already in place on the line, and serve as the high voltage connection of the meter.

The measuring device 10' further comprises five energy detectors DE'1 to DE'5, analogous to those used with the four wire network, and providing energy pulses of which the frequencies are proportional to the quantities W'$_1$ to W'$_5$. The energy detectors DE'1 to DE'5 respectively receive the following pairs of voltages:

$(\vec{i'_1}, \vec{u'_{13}})$, $(\vec{i'_1}, \vec{u'_{23}})$, $(-\vec{i'_1}, \vec{u'_{13}})$, $(\vec{i'_2}, \vec{u'_{23}})$ and $(-\vec{i'_2}, \vec{u'_{23}})$. To take account of the sign affecting the voltages $i'_1$ and $i'_2$ applied to DE'3 to DE'5, the current inputs of these converters are reversed with respect to DE'1 and DE'4. Furthermore, to take account of the coefficient ½ appearing in the relationships (5'), two divide by two dividers DF'1 and DF'4 can be connected to the outputs of the detectors DE'1 and DE'4. Each sensor DE'1 and DE'4 has a positive output W'₁+ to W'₅+ at which are provided positive energy pulses E'₁+ to E'₅+ and a negative output W'₁− to W'₅− at which are provided energy pulses E'₁− to E'₅−.

The calculating device 20' is identical to that described hereinabove in the case of the four wire network except that the register RTA receives four energy pulse signals (E'₁+, E'₁−, E'₄+, E'₄−,) instead of 6, the register RTR receiving the six remaining signals (E'₂+, E'₂−, E'₃+, E'₃−, E'₅+, E'₅−).

We claim:

1. An electronic meter for measuring active and reactive energy on a three-phase network comprising:
    a plurality of current and voltage converters responsive to the currents and voltages, respectively, flowing in each line of said network and for generating signals representative thereof;
    a plurality of single-phase energy sensors responsive to each of the signals generated by the current and voltage converters for generating pulses representative of the active and reactive energy flowing through each of the lines;
    means for determining the direction of flow of energy through each of the lines; and
    at least first and second pulse accumulating means, responsive to the means for determining the direction of flow of energy, for accumulating the pulses generated by the energy sensors such that the net number of accumulated pulses accumulated by the first pulse accumulation means is representative of the active energy flowing in the network and the net number of accumulated pulses accumulated by the second pulse accumulating means is representative of the reactive energy flowing in the network.

2. A meter according to claim 1, for measuring active and reactive energy on a three-phase four-wire network, wherein the voltage converters comprise transformers coupled to the three phase voltages of the network and the energy sensors provide pulses whose frequencies are respectively proportional to the quantities $I_1 \cdot V_1$, $I_1 \cdot V_2$, $I_2 \cdot V_2$, $I_2 \cdot V_3$, $I_3 \cdot V_3$, and $I_3 \cdot V_1$, where $I_1$, $I_2$ and $I_3$ designate the phase currents and, $V_1$, $V_2$ and $V_3$ designate the phase voltages.

3. A meter according to claim 1, for measuring active and reactive energy on a three-phase three wire network, wherein the voltage converters comprise transformers coupled to two interphase voltages of the network and the energy sensors provide pulses whose frequencies are respectively proportional to the quantities $I'_1 \cdot U'_{13}$, $I'_1 \cdot U'_{23}$, $-I'_1 \cdot U'_{23}$, $I'_2 \cdot U'_{23}$, and $-I'_2 \cdot U'_{13}$, where $I'_1$ and $I'_2$ are the currents of the first and second phases, and $U'_{13}$ and $U'_{23}$ are the interphase voltages of said first and second phases and the third phase.

4. A meter according to claim 1 wherein each of said energy sensors include means for generating the pulses such that each pulse represents the same amount of energy in absolute value.

5. A meter according to claim 4, wherein each of said energy sensors includes means for dividing by 2 the frequency of the pulses forming the components of the active energy sought.

6. A meter according to claim 1 wherein each of said energy sensors includes a positive output and a negative output, and responsive to said means for determining the direction of transfer of energy on the network for delivering positive or negative energy pulses appearing at its positive or negative output, respectively.

7. A meter according to claim 6, wherein the first accumulating means comprises an active energy tendency register controlled by the pulses supplied by the single phase energy sensors which sense the energies forming the components of the active energy sought, said tendency register including means for accumulating pulses in a first direction in response to positive energy pulses and in the opposite direction in response to negative energy pulses, said active energy tendency register accumulating and holding pulses between an upper value and a lower value, a positive active energy accumulation register of which the contents are incremented in response to each positive active energy pulse when the pulses accumulated in the active energy tendency register are at said upper value, a negative active energy accumulation register of which the contents are incremented in response to each negative active energy pulse when the pulses accumulated in the active energy tendency register are at said lower value, and wherein the second accumulating means comprises a reactive energy tendency register controlled by the pulses delivered by the single phase energy sensors which sense the energies forming the components of the reactive energy sought, said reactive tendency register including means for accumulating pulses in a first direction in response to positive energy pulses and in the opposite direction in response to negative energy pulses, said reactive energy tendency register accumulating and holding pulses between an upper value and a lower value, a positive reactive energy accumulation register of which the contents are incremented in response to each positive reactive energy pulse when the pulses accumulated in the reactive energy tendency register are at said upper value, and a negative reactive energy accumulation register of which the contents are incremented in response to each negative reactive energy pulse when the pulses accumulated in the reactive tendency register are at said lower value.

8. A meter according to claim 7, wherein each tendency registers can take a plurality of intermediate values between said upper and lower values.

9. A meter according to claim 1 wherein each of said energy sensors comprises a multiplier circuit receiving the signals representative of the voltages and currents flowing in each line of the network applied to first and second inputs of the sensor and producing a voltage representative of the product of these signals, a voltage-to-frequency converter circuit coupled to the multiplier circuit for producing pulses at a frequency proportional to the voltage produced by the multiplier circuit, an up/down counter which receives said pulses, means responsive to the means for detecting the direction of flow of energy for controlling the direction of counting of the up/down counter, and a decoding circuit which generates a positive energy pulse and resets the up/down counter to an initial value when the contents of the up/down counter reach a first predetermined value and which generates a negative energy pulse and resets the up/down counter to said initial value when the contents of the up/down counter reach a second predetermined value.

10. A meter according to claim 9, wherein said up/down counter control means comprises means for generating reversing pulses of fixed frequency for causing the up/down counter to count in opposite direction alternately during periods of equal duration, and there is further provided inverting means controlled by the reversing pulses for inverting, in synchronism with the reversing pulses, the phase of one of the signals received by the multiplier circuit.

* * * * *